United States Patent
Shirakawa (10) Patent No.: US 10,630,046 B2
(45) Date of Patent: Apr. 21, 2020

(54) LASER LIGHT SOURCE DEVICE AND LASER LIGHT ADJUSTING METHOD

(71) Applicant: MITUTOYO CORPORATION, Kanagawa (JP)

(72) Inventor: Yusuke Shirakawa, Tokyo (JP)

(73) Assignee: MITUTOYO CORPORATION, Kanagawa (JP)

( * ) Notice: Subject to any disclaimer, the term of this patent is extended or adjusted under 35 U.S.C. 154(b) by 0 days.

(21) Appl. No.: 16/281,688

(22) Filed: Feb. 21, 2019

(65) Prior Publication Data

US 2019/0267771 A1    Aug. 29, 2019

(30) Foreign Application Priority Data

Feb. 26, 2018   (JP) .................................. 2018-031862

(51) Int. Cl.

| | |
|---|---|
| *H01S 3/13* | (2006.01) |
| *H01S 3/136* | (2006.01) |
| *H01S 3/10* | (2006.01) |
| *H01S 3/04* | (2006.01) |
| *H01S 3/16* | (2006.01) |
| *H01S 3/139* | (2006.01) |

(52) U.S. Cl.
CPC .......... *H01S 3/1303* (2013.01); *H01S 3/0401* (2013.01); *H01S 3/0405* (2013.01); *H01S 3/10069* (2013.01); *H01S 3/136* (2013.01); *H01S 3/139* (2013.01); *H01S 3/1611* (2013.01); *H01S 3/1673* (2013.01)

(58) Field of Classification Search
CPC ...... H01S 3/1303; H01S 3/139; H01S 3/0401; H01S 3/1673; H01S 3/1611; H01S 3/0405; H01S 3/10069; H01S 3/136
See application file for complete search history.

(56) References Cited

U.S. PATENT DOCUMENTS

| | | | | |
|---|---|---|---|---|
| 6,229,832 B1 * | 5/2001 | Baba | .................. | H01S 5/06808 |
| | | | | 372/29.011 |
| 7,613,216 B2 * | 11/2009 | Nakagawa | ............ | H01S 3/1392 |
| | | | | 372/29.011 |

(Continued)

FOREIGN PATENT DOCUMENTS

JP     2008-141054 A     6/2008

*Primary Examiner* — Xinning(Tom) Niu
(74) *Attorney, Agent, or Firm* — Greenblum & Bernstein, P.L.C.

(57) ABSTRACT

A laser light adjusting method includes detecting a pair of mode hops and a comparison saturated absorption line group of the pair of mode hops based on an intensity of a light output signal in response to a change applied to an actuator, comparing a mode center voltage value with a comparison voltage value which is the voltage value at which the comparison saturated absorption line group was generated; a control temperature adjustment process that increases a control temperature when the comparison voltage value is lower than the mode center voltage value, and that decreases the control temperature of the temperature adjuster when the comparison voltage value is greater than the mode center voltage value; and a laser light stabilization step that stabilizes an emission frequency of the laser light to a specific saturated absorption line after the control temperature adjustment process.

4 Claims, 4 Drawing Sheets

(56) References Cited

U.S. PATENT DOCUMENTS

| | | |
|---|---|---|
| 7,835,411 B2 | 11/2010 | Masuda et al. |
| 8,958,446 B2 | 2/2015 | Hirose |
| 9,231,364 B2 | 1/2016 | Yano |
| 9,825,423 B2 | 11/2017 | Yano et al. |
| 2013/0195132 A1 | 8/2013 | Yano et al. |
| 2016/0118769 A1 | 4/2016 | Narumi |
| 2017/0373463 A1 | 12/2017 | Narumi et al. |
| 2019/0131759 A1 | 5/2019 | Shirakawa |

* cited by examiner

LASER LIGHT SOURCE DEVICE AND LASER LIGHT ADJUSTING METHOD

CROSS-REFERENCE TO RELATED APPLICATIONS

The present application claims priority under 35 U.S.C. § 119 of Japanese Application No. 2018-031862, filed on Feb. 26, 2018, the disclosure of which is expressly incorporated by reference herein in its entirety.

BACKGROUND OF THE INVENTION

1. Field of the Invention

The present invention relates to a laser light source device and a laser light adjusting method.

2. Description of Related Art

Conventionally, a laser light source device is known which includes an excitation light source that emits excitation light, a resonator that receives the excitation light from the excitation light source and generates laser light, a laser light modulation mechanism that modulates the light emitted from the resonator with an absorption cell such as an iodine cell, and a control structure that controls the resonator such that an emission wavelength is stabilized to a saturated absorption line of the absorption cell (see Japanese Patent Laid-open Publication No. 2008-141054, for example).

In the conventional laser light source device described in Japanese Patent Laid-open Publication No. 2008-141054 A, various elements such as a solid-state laser medium, a nonlinear optical crystal, and an etalon are arranged inside the resonator. The wavelength conversion efficiency of these elements changes due to a condition such as temperature, and therefore, the temperature of each element must be kept at an optimum value in order for the resonator to continuously convert a target wavelength. Given this, in the conventional laser light source device, the temperature of each element inside the resonator has been adjusted so as to output laser light having a desired wavelength at a high output level.

However, in the conventional laser light source device, the temperature of each element inside the resonator is fixed in a state where the laser light emitted from the resonator is adjusted. Therefore, when mechanical alignment of each element inside the resonator changes due to time-related changes and the like of the laser light source device, a range of the emission wavelength of the laser light output from the resonator may be shifted. In particular, a phenomenon called a "mode hop" occurs in which the output of the laser light rapidly changes depending on the resonator length. When the saturated absorption line overlaps with a position of a signal change that is due to the mode hop because of the emission wavelength range of the resonator shifting, a desired saturated absorption line for stabilization of the laser light may not be obtained. Further, in a general laser light source device, a resonator housing is closed after adjusting the mechanical alignment of each element inside the resonator, and therefore, it is difficult to readjust the mechanical alignment of the each element.

SUMMARY OF THE INVENTION

The present invention provides a laser light source device and a laser light adjusting method that can reliably obtain a desired saturated absorption line.

The present invention includes a resonator having a laser medium that receives an excitation light and generates a fundamental wave light, and a nonlinear optical crystal that converts the fundamental wave light into a laser light with a target wavelength; an absorption cell which is irradiated by the laser light; a light converter that converts the laser light that passes through the absorption cell into a light output signal; a temperature adjuster that adjusts the temperature of the nonlinear optical crystal; an actuator changing a resonator length of the resonator in accordance with an application of voltage; and a control structure. The control structure includes an actuator controller that controls the voltage applied to the actuator; a detector that detects, based on an intensity of the light output signal in response to a change in the voltage, any pair of adjacent mode hops and a comparison saturated absorption line group that is generated between the pair of mode hops; a comparer that compares a mode center voltage value (median value of each voltage value at which the pair of mode hops were generated) with a comparison voltage value which is the voltage value at which the comparison saturated absorption line group was generated; and a control temperature adjuster that increases a control temperature of the temperature adjuster when the comparison voltage value is lower than the mode center voltage value, and decreases the control temperature of the temperature adjuster when the comparison voltage value is greater than the mode center voltage value.

In the present invention, when the comparison voltage value is lower than the mode center voltage value, the temperature of the nonlinear optical crystal is increased due to the control temperature of the temperature adjuster increasing. Then, the laser light that is converted by the nonlinear optical crystal is shifted toward a higher wavelength, and therefore, the saturated absorption line group is generated with a greater voltage value. On the other hand, when the comparison voltage value is greater than the mode center voltage value, the temperature of the nonlinear optical crystal is decreased due to the control temperature of the temperature adjuster decreasing. Then, the laser light that is converted by the nonlinear optical crystal is shifted toward a lower wavelength, and therefore, the saturated absorption line group is generated with a lower voltage value.

According to the configuration noted above, the comparison saturated absorption line group is generated in the vicinity of the mode center voltage value. In this example, the mode center voltage value is a median value of each voltage value at which the pair of mode hops were generated, and therefore, so long as the comparison saturated absorption line group is generated in the vicinity of the mode center voltage value, the comparison saturated absorption line group is not most affected by the mode hops. In addition, the mode hops and the saturated absorption line group are generated at every fixed interval of the resonator length. Therefore, by adjusting the control temperature of the temperature adjuster such that the comparison saturated absorption line group is generated in the vicinity of the mode center voltage value, the saturated absorption line group including the comparison saturated absorption line group can be adjusted so as to be generated at the voltage value least affected by the mode hops.

Therefore, in the laser light source device of the present invention, even when a range of emission wavelength of the resonator is shifted due to time-related degradation and the like, an offset of the emission wavelength range of the resonator can be corrected so as to generate the saturated absorption line group at a resonator length with a limited effect from the mode hops. Accordingly, a desired saturated absorption line to stabilize the laser light can be reliably obtained.

The present invention provides a laser light adjusting method of a laser light source device that includes a resonator having a laser medium that receives an excitation light and generates a fundamental wave light, and a nonlinear optical crystal that converts the fundamental wave light into a laser light with a target wavelength; an absorption cell which is irradiated by the laser light; a light converter that converts the laser light that passes through the absorption cell into a light output signal; a temperature adjuster that adjusts the temperature of the nonlinear optical crystal; and an actuator changing a resonator length of the resonator in accordance with an application of voltage. The method includes a detection step that changes the voltage and, based on the intensity of the light output signal in response to the change in the voltage, detects any pair of adjacent mode hops and a comparison saturated absorption line group that is generated between the pair of mode hops; a comparison step that compares a mode center voltage value (median value of each voltage value at which the pair of mode hops were generated) with a comparison voltage value which is the voltage value at which the comparison saturated absorption line group was generated; a control temperature adjustment step that increases a control temperature of the temperature adjuster when the comparison voltage value is lower than the mode center voltage value, and decreases the control temperature of the temperature adjuster when the comparison voltage value is greater than the mode center voltage value; and a laser light stabilization step that stabilizes an emission frequency of the laser light to a specific saturated absorption line after the control temperature adjustment step. With such a method, as described above, the desired saturated absorption line to stabilize the laser light can be reliably obtained and the laser light can be reliably stabilized.

The present invention is capable of reliably obtaining the desired saturated absorption line to stabilize the laser light.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Figure 1:
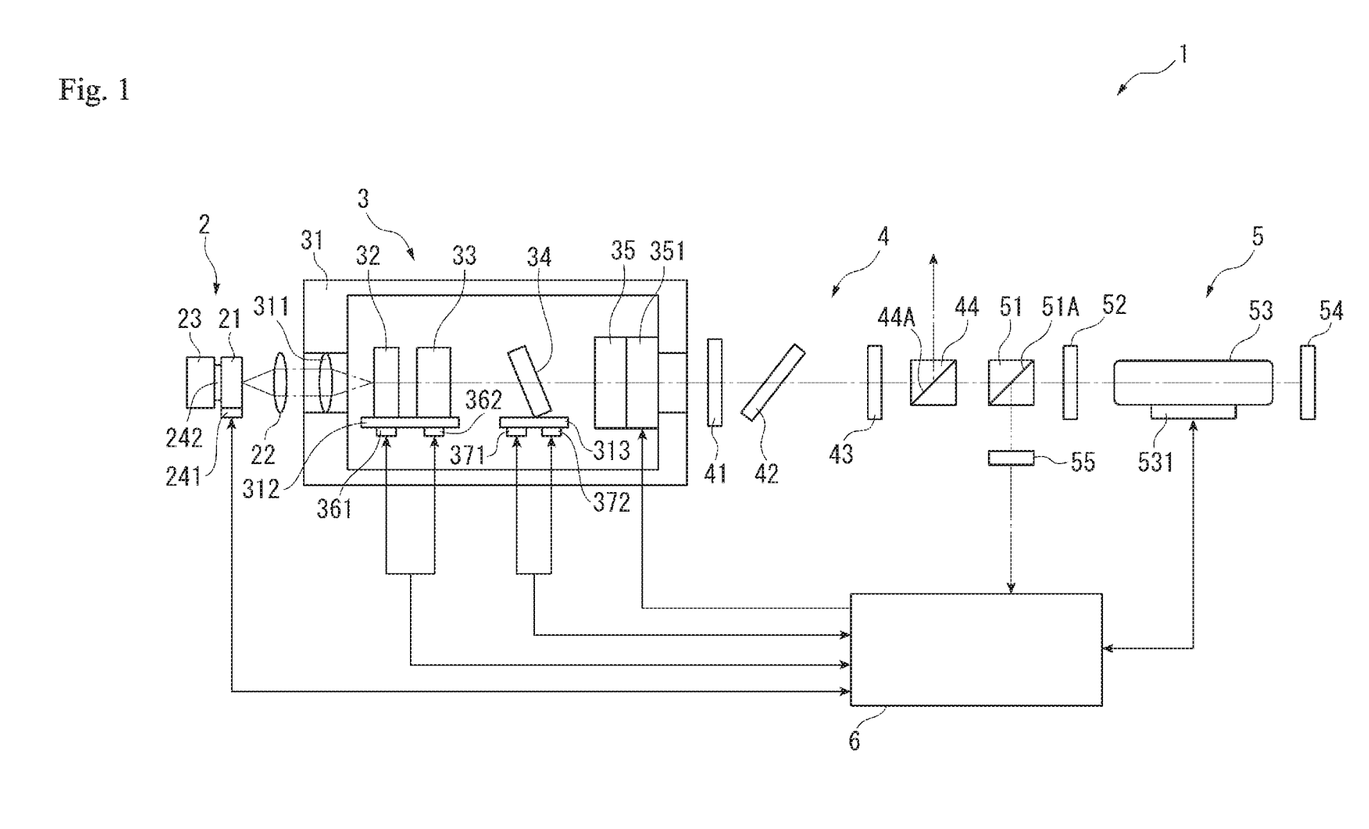
FIG. 1 is a block diagram illustrating a laser light source device according to an embodiment of the present invention.

Hereafter, an embodiment of the present invention is described. FIG. 1 is a block diagram illustrating a laser light source device 1 of the present embodiment. The laser light source device 1 includes a light source 2 that emits light, a resonator 3, a light guide mechanism 4 that guides the light emitted from the resonator 3, a laser light modulation mechanism 5 that modulates the light emitted from the resonator 3, and a control structure (controller) 6.

Configuration of Light Source

The light source 2 is an excitation light source and includes a semiconductor laser 21, a collimator lens 22, a heat release plate 23, a temperature sensor 241, and a temperature adjuster 242. When there is a flow of drive current controlled by the control structure 6, the semiconductor laser 21 emits excitation light of a wavelength (near 808 nm, for example) that is capable of generating a fundamental wave light. The collimator lens 22 collimates the excitation light emitted from the semiconductor laser 21. The heat release plate 23 is provided on a rear surface side of the semiconductor laser 21 and releases the heat of the semiconductor laser 21. The temperature sensor 241 is configured by, for example, a thermistor and is provided to the semiconductor laser 21. The temperature sensor 241 can detect the temperature of the semiconductor laser 21 and outputs a signal based on the detected temperature to the control structure 6. The temperature adjuster 242 is configured by a Peltier element or the like and is provided between the semiconductor laser 21 and the heat release plate 23. The temperature adjuster 242 adjusts the temperature of the semiconductor laser 21 to a defined temperature in accordance with a control signal input from the control structure 6.

Configuration of Resonator

The resonator 3 includes a focus lens 311, a solid-state laser medium 32, a nonlinear optical crystal 33, an etalon 34, a resonator mirror 35, an actuator 351, a laser element support portion 312, an etalon support portion 313, temperature sensors 361 and 371, temperature adjusters 362 and 372, and a casing 31 housing these internally.

The focus lens 311 collects the excitation light collimated by the collimator lens 22. The solid-state laser medium 32 is, for example, an Nd:YVO$_4$ crystal and is excited by the excitation light collected by the focus lens 311 to emit a light of a wavelength near 1064 nm (fundamental wave light). The nonlinear optical crystal 33 is, for example, a KTP crystal and converts the fundamental wave light emitted from the solid-state laser medium 32 into a light of a target wavelength near 532 nm (second harmonic wave light).

The etalon 34 is arranged at a latter stage of an optical path of the nonlinear optical crystal 33 and allows passage of a light having a predetermined wavelength. The etalon 34 transforms the fundamental wave light, which exhibits multimode oscillation, into single mode, and also transforms a second harmonic wave light converted by the nonlinear optical crystal 33 into single mode. The resonator mirror 35 is arranged at a latter stage of the optical path of the etalon 34 and is attached to the casing 31 via the actuator 351 (a piezo element, for example). By controlling the voltage applied to the actuator 351, the resonator mirror 35 can move along an optical axis direction of the resonator 3 (resonator length is changed).

The laser element support portion 312 supports the solid-state laser medium 32 and the nonlinear optical crystal 33. The etalon support portion 313 supports the etalon 34. The laser element support portion 312 and the etalon support portion 313 may be configured integrally with the casing 31 or also may be provided separately from the casing 31. In addition, the laser element support portion 312 and the etalon support portion 313 are preferably formed by a material having high thermal conductivity.

The laser element support portion 312 is provided with the temperature sensor 361 and the temperature adjuster 362. The temperature sensor 361 is configured by a thermistor for example, detects the temperatures of the solid-state laser medium 32 and the nonlinear optical crystal 33, and outputs a signal based on the detected temperature to the control structure 6. The temperature adjuster 362 is configured by a Peltier element or the like, for example, and adjusts the temperatures of the solid-state laser medium 32 and the nonlinear optical crystal 33 to a defined temperature via the laser element support portion 312 in accordance with a control signal input from the control structure 6.

The etalon support portion 313 is provided with the temperature sensor 371 and the temperature adjuster 372. The temperature sensor 371 is configured by a thermistor for example, detects the temperature of the etalon 34, and outputs a signal based on the detected temperature to the control structure 6. The temperature adjuster 372 is configured by a Peltier element, for example, and adjusts the temperature of the etalon 34 to a defined temperature via the etalon support portion 313 in accordance with a control signal input from the control structure 6.

In the resonator 3, on a surface of the semiconductor laser 21 side of the solid-state laser medium 32, a coating is applied to transmit the excitation light through and to reflect the fundamental wave light. Further, on a surface of the solid-state laser medium 32 side of the resonator mirror 35, a coating is applied to reflect the fundamental wave light and to transmit the second harmonic wave light through. The fundamental wave light incident on the resonator 3 travels back and forth between the solid-state laser medium 32 and the resonator mirror 35 to exhibit multimode oscillation and the second harmonic wave light converted by the nonlinear optical crystal 33 passes through the resonator mirror 35 and is emitted from the resonator 3.

Configuration of Optical Guide Mechanism

The optical guide mechanism 4 is arranged at a latter stage of the optical path of the resonator 3 and includes filters 41 and 42, a ½ wave plate 43, and a polarized beam splitter 44.

The filter 41 attenuates the excitation light which is leaked from the resonator 3. The filter 42 is arranged in an inclined state relative to the optical axis of the laser light source device 1. The filter 42 reflects the fundamental wave light leaked from the resonator 3 and guides the light in a direction away from the optical axis of the laser light source device 1, and also allows the second harmonic wave light to pass through. The ½ wave plate 43 adjusts a polarization direction of the light that passes through the filters 41 and 42. The polarized beam splitter 44 includes a polarization separation film 44A and splits the light striking the polarization separation film 44A into a reflected light and a transmitted light.

The optical path of the optical guide mechanism 4 is now described. The second harmonic wave light of the light emitted from the resonator 3 passes through the filters 41 and 42, the polarization direction is adjusted by the ½ wave plate 43, and the light strikes the polarized beam splitter 44. The light striking the polarized beam splitter 44 separates into a P polarized light beam that passes through the polarization separation film 44A and an S polarized light beam that is reflected by the polarization separation film 44A. The S polarized light beam reflected by the polarized beam splitter 44 is emitted outside of the laser light source device 1 and is used as laser light for measuring length and the like.

Configuration of Laser Light Modulation Mechanism

The laser light modulation mechanism 5 is arranged at a latter stage of the optical path of the optical guide mechanism 4 and includes a polarized beam splitter 51, a ¼ wave plate 52, an iodine cell (absorption cell) 53, a reflecting mirror 54, and an intensity detector (light converter) 55. The polarized beam splitter 51 includes a polarization separation film 51A and splits the light striking the polarization separation film 51A into a reflected light and a transmitted light. The ¼ wave plate 52 delays a phase of the incident light by 90°. A cell temperature adjustment mechanism 531 configured by a thermistor or a temperature adjuster is attached to the iodine cell 53. The cell temperature adjustment mechanism 531 adjusts the temperature of the iodine cell 53 to a defined standard reference value in accordance with a control signal input from the control structure 6. Accordingly, an absorption line (wavelength) of the iodine cell 53 is set to a desired value. The reflecting mirror 54 reflects the light that passes through the iodine cell 53. The intensity detector 55 detects the optical intensity of the incident light and outputs a light output signal based on the detected optical intensity to the control structure 6.

The optical path of the laser light modulation mechanism 5 is now described. The P polarized light beam (laser light) that is transmitted through the polarized beam splitter 44 passes through the polarized beam splitter 51 and then bombards the iodine cell 53 via the ¼ wave plate 52. The light that passes through the iodine cell 53 is reflected by the reflecting mirror 54 and passes through the iodine cell 53 and ¼ wave plate 52, and re-strikes the polarized beam splitter 51. At this point, the light re-striking the polarized beam splitter 51 has passed through the ¼ wave plate 52 twice, and therefore the polarization direction is rotated by 90° and the light becomes the S polarized light beam with respect to the polarization separation film 51A. Therefore, the light re-striking the polarized beam splitter 51 is reflected by the polarization separation film 51A. The light reflected by the polarized beam splitter 51 strikes the intensity detector 55.

Configuration of Control Structure

Figure 2:
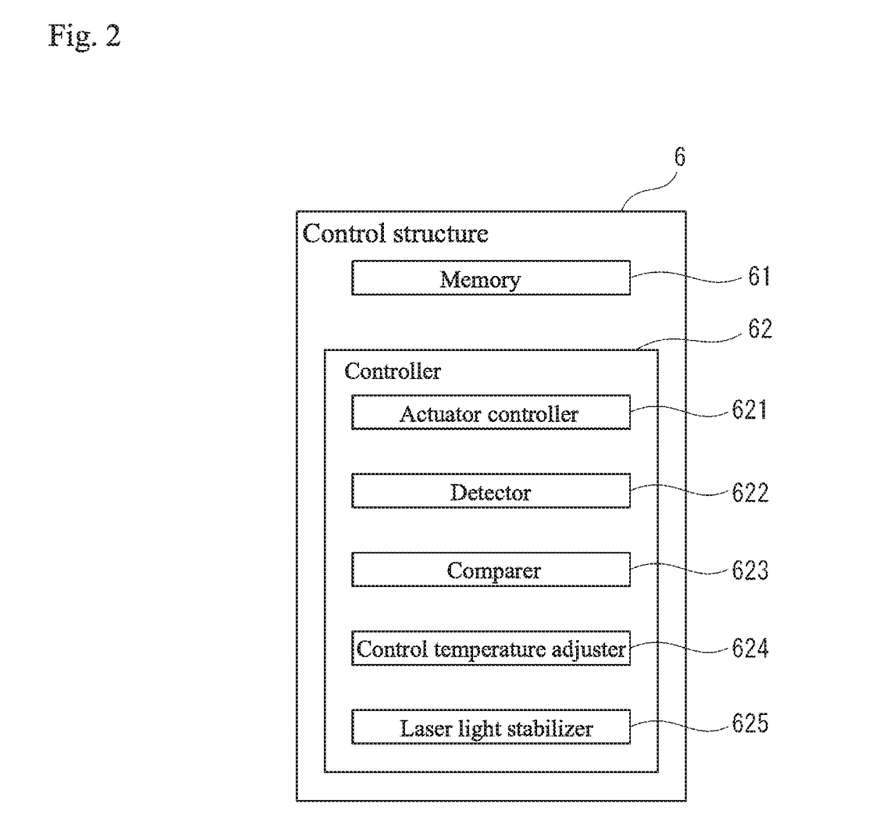
FIG. 2 is a block diagram illustrating a configuration of functions of a control structure according to the embodiment.

FIG. 2 is a block diagram illustrating the control structure 6 according to the embodiment. The control structure 6 includes a memory 61 configured with a memory and the like, and a controller 62 configured with a CPU (Central Processing Unit, or processor) and the like. The controller 62 reads and executes a program stored in the memory 61 and serves as an actuator controller 621, a detector 622, a comparer 623, a control temperature adjuster 624, and a laser light stabilizer 625.

By controlling voltage applied to the actuator 351, the actuator controller 621 changes a position of the resonator mirror 35 and changes the resonator length of the resonator 3. The detector 622 and the comparer 623 perform a laser light adjustment process which is described hereafter. Based on signals input from the temperature sensors 241, 361, and 371 respectively, the control temperature adjuster 624 controls the temperatures of the temperature adjusters 242, 362, and 372 respectively so as to keep each element of the semiconductor laser 21, the nonlinear optical crystal 33, and the etalon 34 at a respective defined temperature. In addition, the control temperature adjuster 624 controls the cell temperature adjustment mechanism 531 such that the temperature of the iodine cell 53 is equal to a predetermined standard reference value. Further, the control temperature adjuster 624 performs the laser light adjustment process which is described hereafter.

Laser Light Adjusting Method

Figure 3:
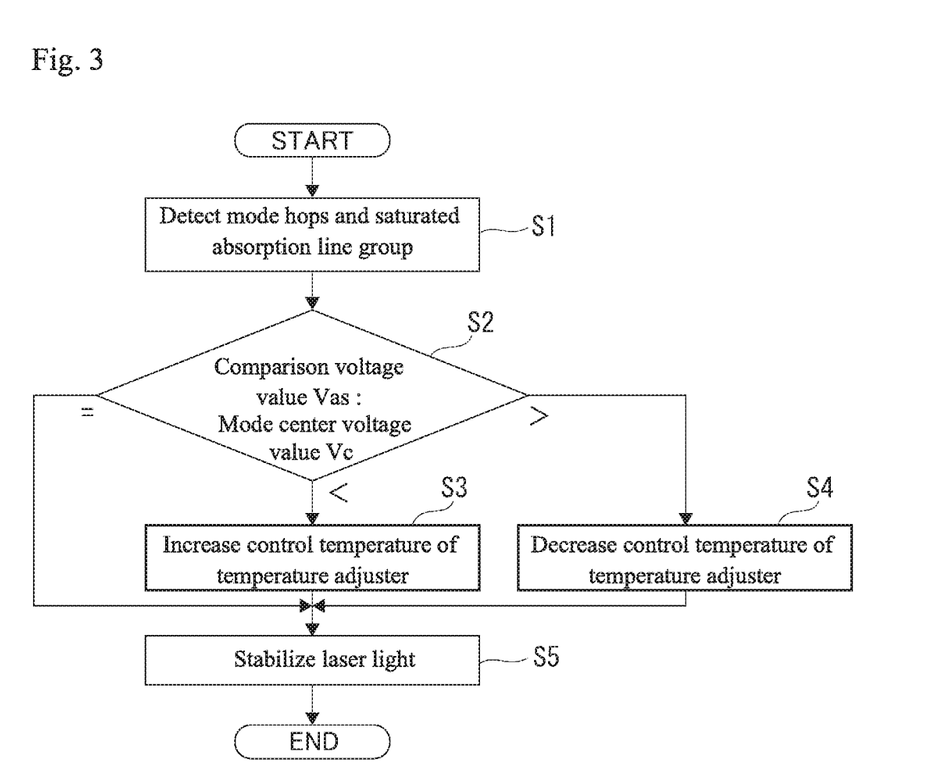
FIG. 3 is a flow chart illustrating a laser light adjustment process of the embodiment.

A laser light adjusting method of the laser light source device 1 is described with reference to FIG. 3. An operation of the laser light source device 1 described below is performed, for example, after the laser light source device 1 is activated and the temperature of each element is kept at the defined temperature.

First, the actuator controller 621 changes the resonator length of the resonator 3 by gradually reducing the output voltage to the actuator 351 from the highest voltage value to the lowest voltage value. Simultaneously, the detector 622 detects an abrupt change of the light output signal as a mode hop H based on the light output signal input from the intensity detector 55. Then, the voltage value where the mode hop H occurs (referred to as a mode hop point Vh) is stored in the memory 61. In addition, based on the light output signal input from the intensity detector 55, the detector 622 detects a peak of the light output signal exceeding a threshold value Sth as a saturated absorption line group A. A voltage value Va where the saturated absorption line group A occurs is stored in the memory 61. Specifically, a median value between the lowest voltage value and the highest voltage value when the peak of the light output signal intersects with the threshold value Sth is defined as a voltage value Va (step S1: detection). When the detector 622 does not detect the mode hop H, the process may proceed to step S5.

Figure 4A:
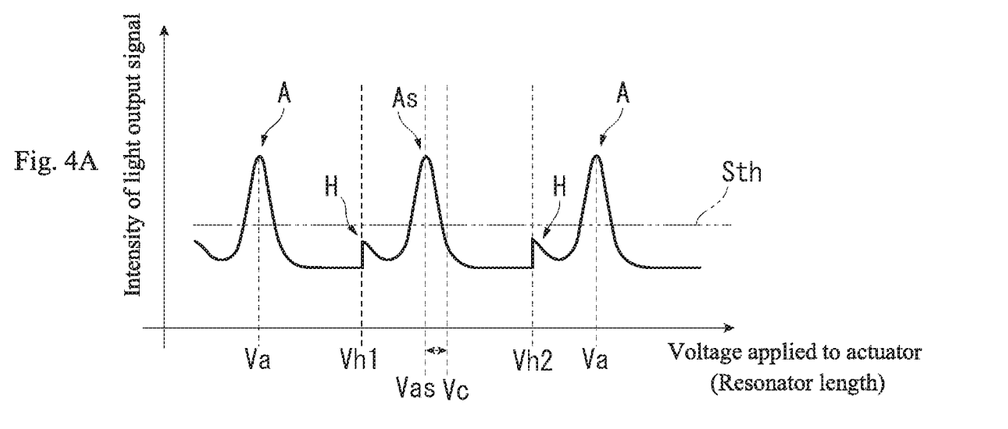
FIGS. 4A and 4B are graphs illustrating a light output signal of the present embodiment: 4A is an example prior to a control temperature adjustment, and 4B is an example after the control temperature adjustment.

FIG. 4A shows an example of the light output signal that is output from the intensity detector 55 in step S1. A plurality of the saturated absorption line groups A and a plurality of mode hops H are observed in the light output signal depicted in FIG. 4A. Although omitted from FIG. 4A, each saturated absorption line group A includes a plurality of saturated absorption lines. In other words, the light output signal depicted in FIG. 4A includes the peaks corresponding to the plurality of saturated absorption lines and enables detection of a peak position (voltage value) for each of the saturated absorption lines using a primary differential signal or a secondary differential signal.

Next, the comparer 623 selects any pair of adjacent mode hop points Vh1 and Vh2 from the mode hop points Vh stored in the memory 61, and calculates the median value of the pair of mode hop points Vh1 and Vh2 as a mode center voltage value Vc. In addition, the comparer 623 selects the voltage value Va that exists between the selected pair of mode hop points Vh1 and Vh2 from the voltage values Va of the saturated absorption line groups A stored in the memory 61. The selected voltage value Va is set as a comparison voltage value Vas and the saturated absorption line group A corresponding to the comparison voltage value Vas is set as a comparison saturated absorption line group As. The comparer 623 compares the comparison voltage value Vas with the mode center voltage value Vc (step S2: comparison).

Figure 4B:
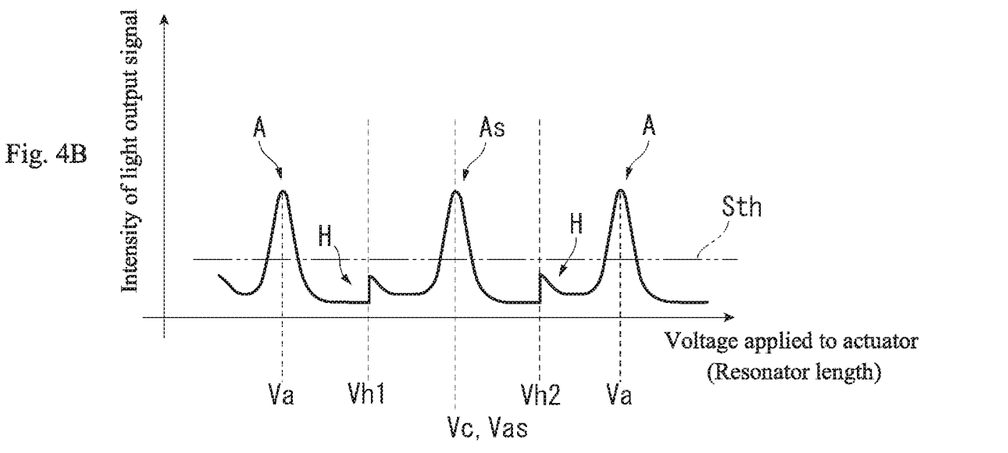

When the comparer 623 determines that the comparison voltage value Vas is lower than the mode center voltage value Vc by at least a predetermined value, the control temperature adjuster 624 raises the control temperature of the temperature adjuster 372 (step S3: control temperature adjustment). Accordingly, the temperature of the nonlinear optical crystal 33 is increased. The laser light converted by the nonlinear optical crystal 33 is shifted toward a higher wavelength, and therefore, the saturated absorption line group A is generated with a greater voltage value. For example, in the example depicted in FIG. 4A, a spectrum that excludes the mode hops H is offset to the right side and changes as depicted in FIG. 4B. The comparison saturated absorption line group As is generated in the vicinity of the mode center voltage value Vc. On the other hand, when the comparer 623 determines that the comparison voltage value Vas is greater than the mode center voltage value Vc by at least a predetermined value, the control temperature adjuster 624 decreases the control temperature of the temperature adjuster 372 (step S4: control temperature adjustment). Accordingly, the temperature of the nonlinear optical crystal 33 is decreased. The laser light converted by the nonlinear optical crystal 33 is shifted toward a lower wavelength, and therefore, the saturated absorption line group A is generated with a lower voltage value. For example, the comparison saturated absorption line group As is generated in the vicinity of the mode center voltage value Vc. In addition, when the comparer 623 determines that a difference between the comparison voltage value Vas and the mode center voltage value Vc is less than the predetermined value (the comparison voltage value Vas and the mode center voltage value Vc are substantially equal), the process proceeds to the next step S5.

The temperature adjuster 372 adjusts not only the temperature of the nonlinear optical crystal 33 but also the temperature of the solid-state laser medium 32; however, the change in each element due to a temperature condition is greater in the nonlinear optical crystal 33 than in the solid-state laser medium 32. The temperature of the temperature adjuster 372 in this example may be set to an extent that the laser light converted by the nonlinear optical crystal 33 is slightly shifted and to an extent that the emission efficiency of the fundamental wavelength from the solid-state laser medium 32 is not affected. In addition, the predetermined value taken as the permissible error to compare the comparison voltage value Vas and the mode center voltage value Vc can be defined as appropriate in accordance with the voltage width between the pair of mode hops appearing in the light output signal and the voltage width of the saturated absorption line group A.

In step S5, the laser light stabilizer 625 stabilizes the laser light by performing a search process on the saturated absorption lines and a frequency locking process on the laser light (laser light stabilization step). The search process and the frequency locking process are similar to the conventional art (see Japanese Patent Laid-open Publication No. 2008-141054, for example), and therefore a description thereof is omitted. The above completes the laser light adjustment process of the laser light source device 1.

Effect of the Embodiment

According to the present embodiment, the comparison saturated absorption line group As is generated in the vicinity of the mode center voltage value Vc. In this example, the mode center voltage value Vc is the median value of the pair of mode hop points Vh1 and Vh2, and therefore, when the comparison saturated absorption line group As is generated in the vicinity of the mode center voltage value Vc, the comparison saturated absorption line group As is the least affected by the mode hops H. In addition, the mode hops H and the saturated absorption line group A are generated at every fixed interval of the resonator length. Therefore, by making adjustment such that the comparison saturated absorption line group As is generated at the mode center voltage value Vc, the saturated absorption line group A including the comparison saturated absorption line group As can be adjusted so as to be generated at the voltage value least affected by the mode hops H.

Therefore, in the laser light source device 1 of the present embodiment, even when a range of emission wavelength of the resonator 3 is shifted due to time-related degradation and the like, an offset of the emission wavelength range of the resonator 3 can be corrected so as to generate the saturated absorption line group A at a resonator length with a limited effect from the mode hops H. Accordingly, the desired saturated absorption line to stabilize the laser light can be readily obtained.

Modification

Moreover, the present invention is not limited to the above-described embodiment, and includes modifications and improvements within a scope capable of achieving the advantages of the present invention. For example, in the embodiment noted above, the median value between the lowest voltage value and the highest voltage value at the time when the saturated absorption line group A intersects with the threshold value Sth is defined as a voltage value corresponding to the saturated absorption line group A in step S1; however, the present invention is not limited to this. For example, the voltage value corresponding to the highest signal intensity of the saturated absorption line group A may be defined as a voltage value corresponding to the saturated absorption line group A. In addition, in the embodiment noted above, the saturated absorption line group A is detected based on the light output signal input from the intensity detector 55 in step S1; however, the present invention is not limited to this. For example, the saturated absorption line group A may be detected based on the secondary differential signal of the light output signal. In this case, the voltage median value between the absorption line for the highest voltage and the absorption line for the lowest voltage included in the saturated absorption line group A may be defined as a voltage value Va of the saturated absorption line group A.

In addition, in the embodiment above, even though the output voltage to the actuator 351 is reduced from the highest voltage value to the lowest voltage value in step S1, the output voltage may be increased from the lowest voltage value to the highest voltage value. Further, when the pair of mode hops H and the comparison saturated absorption line group As therebetween are detected, the process may proceed to the next step.

In addition, in the above embodiment, after performing step S3 or step S4, the process may return to step S1 again and steps S1 to S4 may be repeated until the difference between the comparison voltage value Vas and the mode center voltage value Vc is determined to be within a predetermined value in step S2.

The present invention can be used in a laser light source device in which an emission frequency of laser light is stabilized to a specific saturated absorption line.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A laser light source device comprising:
   a resonator comprising:
      a laser medium that receives an excitation light and generates a fundamental wave light; and
      a nonlinear optical crystal that converts the fundamental wave light into a laser light with a target wavelength;
   an absorption cell configured to be irradiated by the laser light;
   a light converter that converts the laser light that passes through the absorption cell into a light output signal;
   a temperature adjuster that adjusts the temperature of the nonlinear optical crystal;
   an actuator that changes a resonator length of the resonator in accordance with an application of voltage; and
   a controller comprising a processor and a memory that stores an instruction, the controller further comprising, as a configuration when the processor executes the instruction stored in the memory:
      an actuator controller that controls the voltage applied to the actuator;
      a detector that detects, based on an intensity of the light output signal in response to a change in the voltage, any pair of adjacent mode hops and a comparison saturated absorption line group that is generated between the pair of mode hops;
      a comparer that compares a mode center voltage value (median value of each voltage value at which the pair of mode hops were generated) with a comparison voltage value which is the voltage value at which the comparison saturated absorption line group was generated; and
      a control temperature adjuster that increases a control temperature of the temperature adjuster when the comparison voltage value is lower than the mode center voltage value, and that decreases the control temperature of the temperature adjuster when the comparison voltage value is greater than the mode center voltage value.

2. A method of adjusting laser light of a laser light source device that is provided with a resonator having a laser medium that receives an excitation light and generates a fundamental wave light, and further having a nonlinear optical crystal that converts the fundamental wave light into a laser light with a target wavelength, an absorption cell which is irradiated by the laser light, a light converter that converts the laser light that passes through the absorption cell into a light output signal, a temperature adjuster that adjusts the temperature of the nonlinear optical crystal, and an actuator changing a resonator length of the resonator in accordance with an application of voltage, the method comprising:
   changing the voltage and, based on the intensity of the light output signal in response to the change in the voltage, detecting any pair of adjacent mode hops and a comparison saturated absorption line group that is generated between the pair of mode hops;

comparing a mode center voltage value defined as a median value of each voltage value at which the pair of mode hops were generated, with a comparison voltage value defined as the voltage value at which the comparison saturated absorption line group was generated;

a control temperature adjustment process that increases a control temperature of the temperature adjuster when the comparison voltage value is lower than the mode center voltage value, and that decreases the control temperature of the temperature adjuster when the comparison voltage value is greater than the mode center voltage value; and stabilizing an emission frequency of the laser light to a specific saturated absorption line after the control temperature adjustment process.

3. The laser light source device according to claim 1, wherein:

the control temperature adjuster varies the control temperature of the temperature adjuster such that a difference between the comparison voltage value and the mode center voltage value is within a predetermined value.

4. The method according to claim 2, wherein:

the control temperature adjustment process varies the control temperature of the temperature adjuster such that a difference between the comparison voltage value and the mode center voltage value is within a predetermined value.

* * * * *